United States Patent [19]
Topich et al.

[11] Patent Number: 4,616,245
[45] Date of Patent: Oct. 7, 1986

[54] DIRECT-WRITE SILICON NITRIDE EEPROM CELL

[75] Inventors: James A. Topich, Centerville, Ohio; Thomas E. Cynkar, Sunnyvale, Calif.; Raymond A. Turi, Miamisburg; George C. Lockwood, Dayton, both of Ohio

[73] Assignee: NCR Corporation, Dayton, Ohio

[21] Appl. No.: 665,874

[22] Filed: Oct. 29, 1984

[51] Int. Cl.$^4$ ............................................. H01L 29/78
[52] U.S. Cl. ...................................... 357/23.5; 357/54
[58] Field of Search ..................... 357/23.5, 54, 23.14, 357/23.6; 365/185

[56] References Cited
U.S. PATENT DOCUMENTS

| | | |
|---|---|---|
| 4,099,196 | 7/1978 | Simko ........................ 357/23.5 OR |
| 4,274,012 | 6/1981 | Simko . |
| 4,314,265 | 2/1982 | Simko . |
| 4,334,292 | 6/1982 | Kotecha ........................ 365/185 X |
| 4,486,769 | 12/1984 | Simko . |
| 4,532,535 | 7/1985 | Gerber et al. . |

FOREIGN PATENT DOCUMENTS
2042296 9/1980 United Kingdom .

OTHER PUBLICATIONS
Sze, S. M., *Physics of Semiconductor Devices*, Wiley, New York, 1981, pp. 402–404.
Neugebauer et al., "Electrically Erasable Buried-Gate Nonvolatile Read-Only Memory", IEEE Transactions on Electron Devices, vol. ED-24, No. 5, May 1977.

*Primary Examiner*—Andrew J. James
*Assistant Examiner*—Sara W. Crane
*Attorney, Agent, or Firm*—Wilbert Hawk, Jr.; Casimer K. Salys

[57] ABSTRACT

An EEPROM cell which is programmed to a 1 or $\emptyset$ binary state regardless of the prior state of the cell, that is, without erasing. The cell construction includes silicon nitride capacitors between the floating gate and the programming electrodes which enhances the programming characteristics and the endurance and permits the use of a relatively simple double layer polysilicon process and semiconductor structure.

5 Claims, 8 Drawing Figures

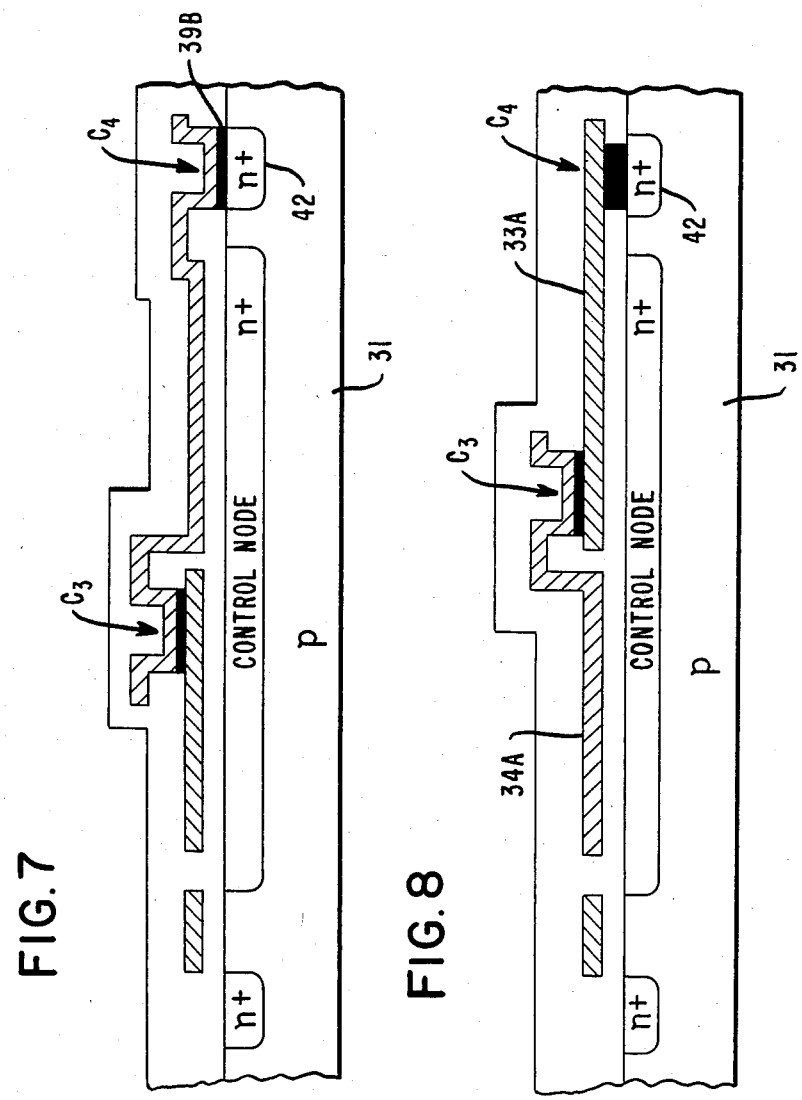

DIRECT-WRITE SILICON NITRIDE EEPROM CELL

BACKGROUND OF THE INVENTION

The present invention relates to an electrically erasable programmable read only memory cell (EEPROM) which can be written directly without first erasing the cell. In addition, the present invention relates to a floating gate EEPROM structure which utilizes silicon nitride as the tunneling dielectric, and to methods for direct-writing the structure to high and low threshold states, here termed VT1 and VT0.

The advantages of the above-mentioned direct write scheme over conventional erase/write schemes are that it eliminates the circuitry required for performing the erase operation and shortens the programming time by eliminating the erase operation.

There are available electrically alterable, nonvolatile memories which use a so-called "transparent erase". This refers to the fact that the user does not have to instruct the part to erase a given location prior to writing data into that location. To the user, it looks like direct write but internally the part has to go through an erase operation before writing and thus requires the associated circuitry.

The first generation of floating gate programmable ROMs were poly(polycrystalline silicon) structures which were programmed by driving the drain junction to avalanche breakdown to generate so-called "hot" electrons which had sufficient energy to tunnel through the thick gate oxide between the drain and the isolated floating gate. These devices were termed FAMOS as an acronym for their floating gate, avalanche injection MOS characteristics. FAMOS devices, which are members of the class of devices known as electrically programmable ROMs, are erased by irradiating the device with ultraviolet light.

The second generation programmable ROMs include electrically erasable EEPROM devices. EEPROM technology includes both two-level and three-level structures. In the two-level approach, the second-level polysilicon control gate is capacitively coupled to the underlying gate of a floating gate MOS transistor structure during electrical writing and erasing. As a consequence, the floating gate can be written by applying high voltage to the control gate and ground to the underlying drain. The cell is erased by reversing the polarities.

The three-level stacked EEPROM floating gate cell is potentially perhaps the most efficient floating gate cell in terms of its size and density. Typically, in such a three-level poly EEPROM structure, the first level poly layer includes a reference/ground conductor, the second layer poly includes the floating gate and the third level poly includes a programming/erase electrode. The reference conductor and the floating gate are processed to have upper surface regions containing asperities. These regions generate small currents at locally high electric fields which are sufficient for tunneling charge between the conductors.

Referring now to FIG. 1, there is shown schematically a version of an asperitic three-level nonvolatile memory cell which is disclosed in U.S. Pat. No. 4,274,012. The cell 10 features a diffused bias electrode 15 which is used to effect programming and erasing by capacitive coupling. The relevant elements of the cell include the n+ bias electrode 15 formed in p-type substrate 11, and the overlying, stacked three-layer asperitic sandwich elements comprising program electrode 12, floating gate 13 and store/erase electrode 14. Asperite regions 16 and 17 are formed on the upper surfaces of the program electrode 12 and the floating gate 13 for creating the localized electric fields which permit tunneling through the relatively thick oxide regions 18 and 19. The use of the asperites to enhance tunneling characteristics avoids the necessity of forming thin tunneling oxide layers in large volume commercial production operations.

To write the structure 10, program electrode 12 and transistor gate 20 are set at system ground, $V_{SS}$, and a positive high voltage $+V_W$ is applied to the store/erase gate electrode 14. The program voltage is capacitively coupled via the electrically-floating bias electrode 15 to the floating gate 13, thereby causing electrons to tunnel from the low-potential, program plate 12. To erase, $V_{SS}$ is applied to the bit line 21 and the associated transistor 20 is turned on to connect the $V_{SS}$ low potential bit line 21 to the bias electrode 15 so that the floating gate 13 is held at $V_{SS}$ by capacitive coupling. Simultaneously, the positive write voltage, $+V_W$ is applied to the store/erase electrode 14 to tunnel electrons from the low potential floating gate 13 to the store/erase electrode 14.

The floating gate 13 also serves as the gate of a MOS sense transistor. In the above WRITE 1 or VT1 state, with electrons maintaining the floating gate 13 at a low potential, the sense transistor is held off. Conversely, in the WRITE 0 or VT0 state, floating gate 13 is at a relatively high potential for turning on the associated remote sensing transistor.

The primary advantage of the asperitic cell appears to be that the oxides in the charge transfer regions are or can be considerably thicker than the approximately 100 angstrom thickness used by other such cells. Such thick oxides, perhaps 800 angstroms, can enhance process reproducibility and yields. However, this advantage in the use of asperities or textured poly is accompanied by relatively low endurance (that is, the maximum number of write and erase cycles for which the thresholds VT1 and VT0 can be reliably set). The advantage is also accomplished at the cost of using the asperitic structure and of the accompanying additional process and structure complexity which are inherent to the required three-level poly arrangement. Three levels or layers of polysilicon are required because the textured asperite surfaces can be formed only on the upper surface of the poly and because electron tunneling from the asperite is essentially unidirectional, that is, from the asperitic upper poly surface such as 16 and 17 to the overlying poly layer such as 13 and 14. Other disadvantages include the stringent processing controls which are necessary to maintain a uniform, reproducible surface texture for field emission from the asperitic polysilicon and the reliability of the textured polysilicon oxide.

Accordingly, it is an object of the present invention to provide a direct-write nonvolatile memory cell without the structural and operational constraints of the above-described three-layer poly, asperitic cell.

It is another object of the present invention to provide a simplified direct-write EEPROM cell, that is, an EEPROM memory cell which can be written to a high or low threshold state regardless of the previous threshold state and without first erasing the cell.

It is still another object of the present invention to provide a direct-write EEPROM structure which uses silicon nitride as the dielectric in the critical capacitive-coupled conductance paths.

It is still another object of the present invention to provide a direct-write EEPROM cell adapted to use a low programming voltage and on-chip programming voltage generation using a single five volt power supply.

In one aspect, the present invention relates to a nonvolatile electrically alterable memory cell which comprises a substrate control node or electrode, first and second programming or write electrodes, and a floating gate electrode, arranged so that charge transferred between the floating gate and the two write electrodes programs the floating gate to respective VT1 or VT0 levels. Silicon nitride is formed between the two write electrodes and the floating gate to enhance the conduction properties of the cell and provide improved programming characteristics and endurance. In addition, the use of silicon nitride permits the use of a relatively simple two-level polysilicon process and structure.

In another aspect the write electrodes are formed from one polysilicon layer and the floating gate is formed from a second polysilicon layer. In still another aspect, one write electrode and the floating gate are formed from separate layers of polysilicon and the second write electrode is replaced by a substrate diffusion line.

These and other aspects of the present invention are described in detail in conjunction with the attached drawings in which:

FIG. 7 is an alternative construction to that shown in FIG. 5 in which the ground or reference plate is replaced by a grounded diffusion line; and FIG. 8 is still another alternative construction, in this case, a combination of the structures of FIGS. 6 and 7 in which the grounded reference plate of FIG. 6 is replaced by the grounded diffusion line of FIG. 7.

DETAILED DESCRIPTION

Figure 1:
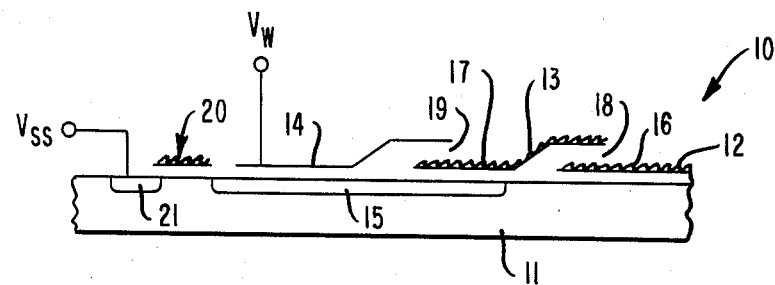
FIG. 1 is a schematicized cross-sectional representation of a prior art three-level polysilicon nonvolatile memory cell.
Figure 2:
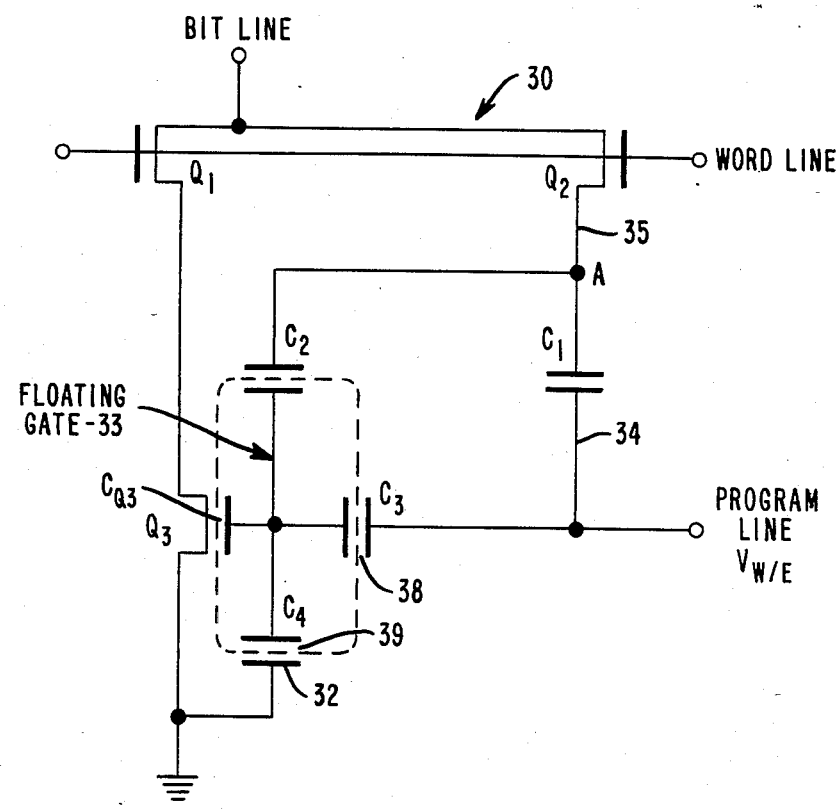
FIG. 2 is a circuit schematic of one embodiment of the direct-write EEPROM cell of the present invention.
Figure 5:
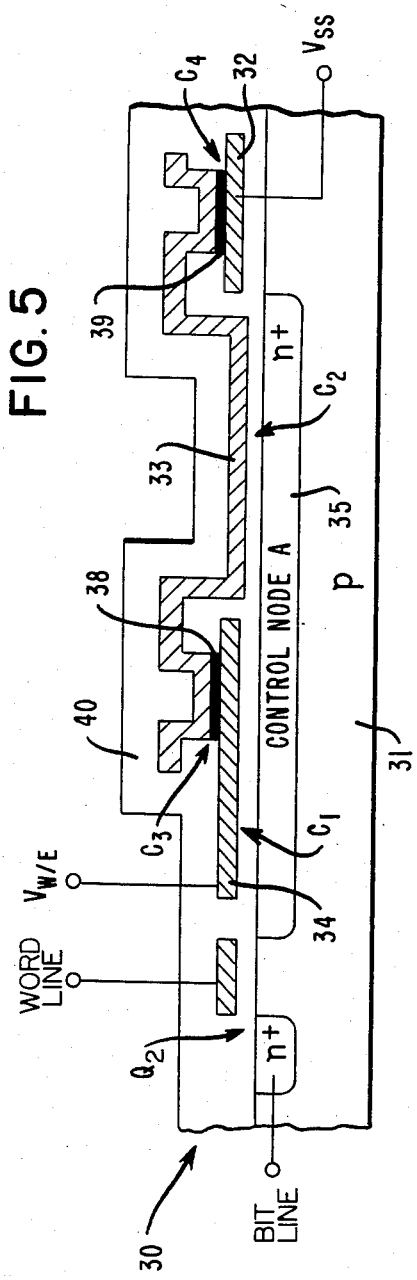
FIG. 5 is a schematicized cross-sectional representation of the basic EEPROM cell structure illustrated in FIGS. 2 through 4.

A schematic of one embodiment 30 of the direct-write nonvolatile memory cell of the present invention is shown in FIG. 2. A cross-section of the basic structure of the corresponding cell is shown in FIG. 5. As used here, "direct-write" means no erasing of the memory cell is required. Regardless of the existing state of the memory cell, a VT1 or a VT0 threshold state can be programmed directly into the cell without first erasing. Typically, the cell 30 shown in FIGS. 2 and 5 is formed on a p-type substrate 31. A highly-doped, n+ substrate diffusion control electrode 35 is formed in the substrate and a grounded reference plate/electrode 32 and a program gate/electrode 34 are formed from the first-level polysilicon. Overlapping floating gate 33 is formed from the second-level polysilicon. These gates are conventionally formed within, that is, electrically isolated by, silicon dioxide layer(s) 40. In a departure from conventional technology and structure, silicon nitride layers 38 and 39 are used as the dielectric between program electrode 34 and floating gate 33, and between floating gate 33 and grounded reference electrode 32. The respective electrode-nitride-electrode structures form capacitors C3 and C4, which are in the critical current conduction paths used to program the EEPROM to high and low voltage threshold states. Typically, the silicon nitride is formed to a thickness of about 100–200 Angstroms to allow Poole-Frenkel conduction.

The circuit also includes a pair of n-channel enhancement mode transistors Q1 and Q2 and floating gate transistor Q3. $C_{Q3}$ is the active gate capacitance of the floating gate transistor Q3. Two additional critical path capacitances are C1, which is formed by the silicon dioxide dielectric between bias control electrode 35 and program electrode 34; and C2, which is formed by the silicon dioxide dielectric between bias control electrode 35 and the floating gate electrode 33. The structure of the cells is such that $C2 \simeq C1 >> C3 \simeq C4$. In addition, the active gate capacitance $C_{Q3} << C1$ or C2.

To program a low threshold VT0 into the EEPROM memory cell of FIGS. 2 and 5, the bit line is held near ground potential and the word line is taken to $V_{CC}$ (approximately +5 volts) to turn on transistors Q1 and Q2, while the program line is raised high, to a voltage $V_{W/E}$ of about +20 volts. When the program line is raised high, the bias control electrode 35 and associated node A are held at ground potential by Q2. $V_{C3}$ and $V_{C4}$ across the critical nitride dielectric capacitors C3 and C4 are then given by:

$$V_{C3} = \frac{C_2 + C_4 + C_{Q3}}{C_2 + C_4 + C_3 + C_{Q3}} V_{W/E} \quad (1)$$

$$V_{C4} = \frac{C_3}{C_2 + C_4 + C_3 + C_{Q3}} V_{W/E} \quad (2)$$

Since $C_2$ is much greater than $C_3$, $C_4$ or $C_{Q3}$, a large percentage of the applied programming voltage $V_{W/E}$ appears by capacitive coupling across C3. Specifically, the voltage $V_{C3}$ is given by the capacitive voltage divider relationship (1) and is a relatively large percentage of the applied programming voltage $V_{W/E}$ for the given capacitance values. Referring to FIG. 5, the positive programming voltage $V_{W/E}$ pulls negative charges, electrons, off the floating gate, which is coupled to ground, $V_{SS}$, by electrode 35, leaving the floating gate positively charged. During a subsequent READ operation, when the cell is accessed the positive charge on the floating gate maintains floating gate transistor $C_{Q3}$ in the "on" state to pull the bit line low indicating threshold voltage stage VT0.

As mentioned above, silicon nitride dielectric layers 38 and 39 are used in capacitor C3 and C4. Although it is an excellent insulator, silicon nitride provides a higher current level than does silicon dioxide. The Poole-Frenkel conduction current through the nitride 38 requires lower program voltages than are required for conventional EEPROM programming. In addition, the current direction is bidirectional, depending upon the potential difference across electrodes 32/33 (or 34/33), and eliminates the third poly level which is required for asperitic cells.

To program a high threshold voltage, VT1, into the memory cell 30, both the bit line and the word line are held at $V_{CC}$ during the program operation, while (as before) the program line is brought to the positive programming voltage, $V_{W/E}$, of about +20 volts. With both the bit line and the word line high, transistor Q2 will turn off as node A begins to rise above $V_{CC}$ due to capacitive coupling from the program line through capacitor $C_1$. The following voltages appear across capacitors $C_3$ and $C_4$:

$$V_{C3} = \frac{C_4 + C_{Q3}}{(C_1 C_2)/(C_1 + C_2) + C_3 + C_4 + C_{Q3}} V_{W/E} \quad (3)$$

$$V_{C4} = \frac{(C_1 C_2)/(C_1 + C_2) + C_3}{(C_1 C_2)/(C_1 + C_2) + C_3 + C_4 + C_{Q3}} V_{W/E} \quad (4)$$

In this case, according to the capacitive voltage divider relationship (4), a large percentage of the programming voltage $V_{W/E}$ appears across capacitor $C_4$ rather than across $C_3$. This voltage causes the floating gate 33 to acquire negatively-charged electrons from the grounded reference plate 32. In particular, since the application of $V_{CC}$ to both the bit line and the word line turns off transistor Q2 as node A begins to rise above $V_{CC}$, the control electrode 35 is floating. Therefore, the program voltage applied at the program electrode 34 is capacitive-coupled by $C_1$ to bias control electrode 35, and further coupled by $C_2$ to floating gate 33. The potential between floating gate 33 and grounded reference plate 32 causes electrons to conduct through the nitride dielectric layer 39 to provide the necessary transport of electrons to the floating gate to raise the threshold voltage of $C_{Q3}$ to VT1.

Reading of the state stored in the cell is performed by bringing the word line to $V_{CC}$, bringing the read gate, where present, to $V_{CC}$, holding the program line at a fixed potential and sensing by way of the bit line whether or not a conductive path exists between the bit line and ground potential.

Those of skill in the art will appreciate that silicon oxynitride is a viable alternative to silicon nitride for the dielectric layers such as 38 and 39.

Figure 3:
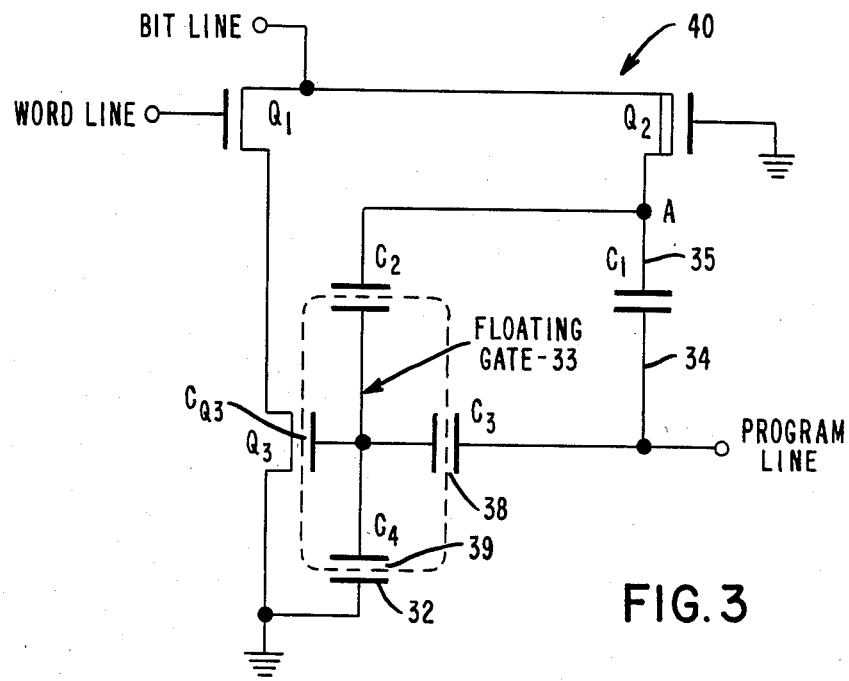
FIGS. 3 and 4 are alternative embodiments of the EEPROM cell of FIG. 2.

An alternative direct-write EEPROM cell 40 is shown in FIG. 3. Cell 40 is identical to cell 30 of FIG. 2 except that transistor Q2 is a depletion mode transistor, typically with a threshold voltage of −1 volt to −3 volts and a grounded gate. In this configuration, Q1 alone is controlled by the word line. The capacitive divider relationships of expressions (1)–(4) and the method of programming described above for EEPROM cell 30 apply to the embodiment 40 as well.

Figure 4:
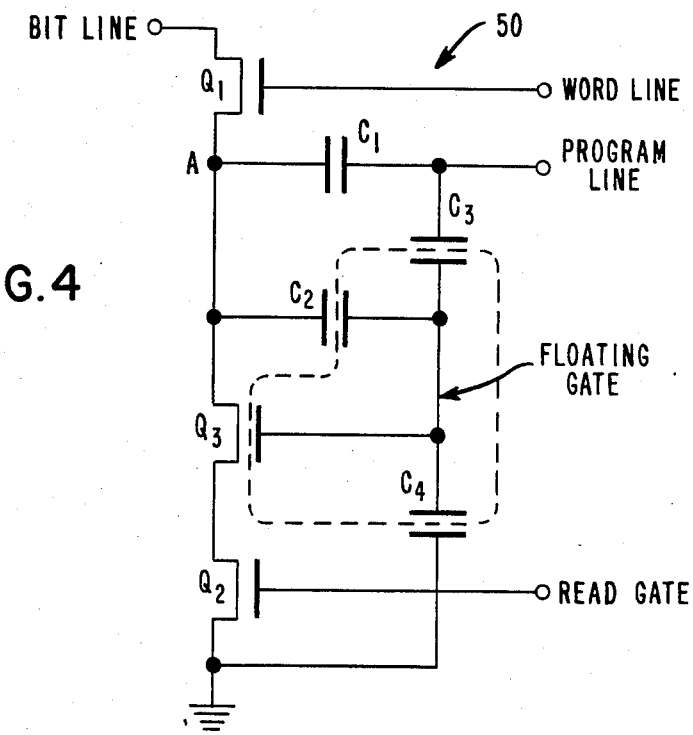

A second alternative embodiment 50 of the present direct-write EEPROM cell is shown in FIG. 4. Again, the capacitive divider relationships (1)–(4) and the programming sequence for EEPROM cell 30 apply. In this case, Q1 is controlled by the word line and Q2 is interposed between the ground reference voltage and the floating gate transistor Q3. The positioning of Q2 is necessary because the control electrode, node A, is an integral part of the current path between the bit line and ground during programming. The control electrode must be allowed to float during the programming sequence and Q2 allows this to happen.

As described previously, the use of silicon nitride eliminates the need for a three-layer polysilicon structure such as that used in U.S. Pat. No. 4,274,012. The three-layer polysilicon stack structure is required in asperitic structures because the textured asperitic surface can be formed only on the upper polysilicon surface. Charge can flow only from one polysilicon layer to an overlying polysilicon layer by means of the enhanced fields associated with the textured upper surface on the lower layer. That is, electron flow is essentially unidirectional from the textured upper surface. In contrast, because of the use of silicon nitride in the structure of the present invention, current flow through the nitride is controlled by the internal nitride field and not by field emission from a textured surface. The current flow is not limited to one direction but rather can flow from one polysilicon layer through the silicon nitride and to a second polysilicon layer beneath it or to the single crystal substrate. In addition to eliminating the need for a third polysilicon layer, the use of silicon nitride improves reliability because of the higher breakdown voltage of silicon nitride as compared to that of the oxide on the textured polysilicon. Also, endurance is improved because the silicon nitride conductivity is not reduced by write-erase cycling.

Figure 6:
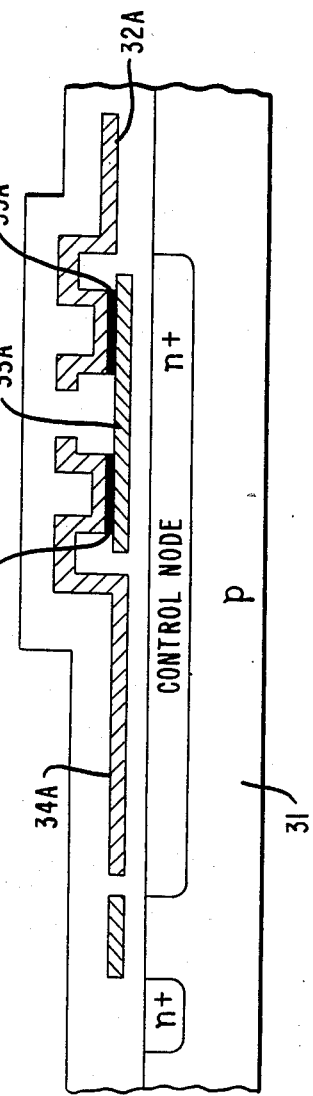
FIG. 6 illustrates an alternative construction to that shown in FIG. 5 in which the roles of the first and second level polysilicon layers are reversed.

Alternative embodiments of the FIG. 5 structure are shown in FIGS. 6, 7 and 8. In each case, the capacitive voltage divider relationships of equations (1)–(4) and the direct-write VT1 and VT0 programming operations are preserved. Specifically, in FIG. 6, the roles of the first-level polysilicon and second-level polysilicon layers are reversed. The floating gate 33A comprises the first-level polysilicon layer, whereas the grounded reference electrode 32A and the program electrode 34A are formed from the second-level polysilicon layer. The silicon nitride dielectric layers 38A and 39A of capacitor C3, C4 are unchanged. Typically, the choice between the structures of FIG. 6 and FIG. 7 would be dictated by the particular processing and layout considerations.

FIG. 7 is also similar to FIG. 5 except that the grounded reference electrode plate 32 is replaced by a grounded diffusion region 42. Here, capacitor C4 is formed by the poly 2 floating gate, silicon nitride layer 39B and the diffusion line 42. The choice between the structures in FIG. 6 and FIG. 8 would be dictated typically by cell layout considerations.

Finally, the structure of FIG. 8 is essentially a combination of the structures of FIGS. 6 and 7 in which the program electrode 34A is part of the second polysilicon layer, the floating gate 33A is part of the first polysilicon layer, and the grounded reference electrode is formed by substrate diffusion line 42.

As mentioned, the basic direct-write EEPROM cell shown in various embodiments in FIGS. 5 through 8 is common to the difference electrical configurations of FIGS. 2 through 4 and the same program operation applies in each case. The program operation, which was described at length above, is summarized in the following table.

TABLE

PROGRAMMING AND READ OPERATION CONNECTIONS

| MODE | BIT LINE | WORD LINE | PROGRAM LINE | READ GATE |
|---|---|---|---|---|
| READ | SENSE AMP | $V_{CC}$ | 0V | $V_{CC}$ |
| PROG. VT1 | $V_{CC}$ | $V_{CC}$ | $V_{W/E}$ | |
| PROG. VT0 | 0V | $V_{CC}$ | $V_{W/E}$ | |

Those skilled in the art will realize that various modifications can be made readily to the present invention and remain within its scope and intent. For example, the opposite substrate and control electrode conductivity types can be used.

Having thus described preferred and alternative embodiments of the direct-write EEPROM cell of the present invention and methods of writing the cell to binary 1 and 0 threshold values, what is claimed is:

1. An electrically programmable nonvolatile memory cell comprising a substrate having a surface adjacent control electrode formed therein and having a dielectric region formed on the surface; an electrically isolated floating gate formed in the dielectric region from a second homogeneous layer overlying and in capacitive relationship with the control electrode; a first write electrode formed in the dielectric region from a first homogeneous layer and adapted for receiving a program voltage, said first write electrode overlying and being in capacitive relationship with the control electrode and underlying and being in capacitive relationship with the floating gate through a dielectric layer selected from silicon nitride and silicon oxynitride interposed between the first write electrode and the floating gate for transporting charge between the floating gate and the first write electrode to write the floating gate to a first voltage level; a second write electrode formed in the dielectric region from a first homogeneous layer and being adapted for receiving a selected reference voltage and underlying and being in capacitive relationship with the floating gate through an interposed dielectric layer selected from silicon nitride and silicon oxynitride for transferring charge between the floating gate and the second write electrode to write the floating gate to a second voltage level; and means for applying a selected voltage to the control electrode to select writing to the first or second voltage level.

2. An electrically programmable nonvolatile memory cell comprising a substrate having a surface adjacent control electrode formed therein and having a dielectric region formed on the surface; an electrically isolated floating gate formed in the dielectric region from a first homogeneous layer overlying and in capacitive relationship with the control electrode; a first write electrode formed in the dielectric region from a second homogeneous layer and adapted for receiving a program voltage, said first write electrode overlying and being in capacitive relationship with the control electrode and overlying and being in capacitive relationship with the floating gate through a dielectric layer selected from silicon nitride and silicon oxynitride interposed between the first write electrode and the floating gate for transporting charge between the floating gate and the first write electrode to write the floating gate to a first voltage level; a second write electrode formed in the dielectric region from a second homogeneous layer and being adapted for receiving a selected reference voltage and overlying and being in capacitive relationship with the floating gate through an interposed dielectric layer selected from silicon nitride and silicon oxynitride for transferring charge betweeen the floating gate and the second write electrode to write the floating gate to a second voltage level; and means for applying a selected voltage to the control electrode to select writing to the first or second voltage level.

3. An electrically programmable nonvolatile memory cell comprising a substrate having a surface adjacent control electrode formed therein and having a dielectric region formed on the surface; an electrically isolated floating gate formed in the dielectric region from a second homogeneous layer overlying and in capacitive relationship with the control electrode; a first write electrode formed in the dielectric region from a first homogeneous layer and adapted for receiving a program voltage, said first write electrode overlying and being in capacitive relationship with the control electrode and underlying and being in capacitive relationship with the floating gate through a dielectric layer selected from silicon nitride and silicon oxynitride interposed between the first write electrode and the floating gate for transporting charge between the floating gate and the first write electrode to write the floating gate to a first voltage level; a second write electrode formed in a substrate region and being adapted for receiving a selected reference voltage and underlying and being in capacitive relationship with the floating gate through an interposed dielectric layer selected from silicon nitride and silicon oxynitride for transferring charge between the floating gate and the second write electrode to write the floating gate to a second voltage level; and means for applying a selected voltage to thee control electrode to select writing to the first or second voltage level.

4. An electrically programmable nonvolatile memory cell comprising a substrate having a surface adjacent control electrode formed therein and having a dielectric region formed on the surface; an electrically isolated floating gate formed in the dielectric region from a first homogeneous layer overlying and in capacitive relationship with the control electrode; a first write electrode formed in the dielectric region from a second homogeneous layer and adapted for receiving a program voltage, said first write electrode overlying and being in capacitive relationship with the control electrode and overlying and being in capacitive relationship with the floating gate through a dielectric layer selected from silicon nitride and silicon oxynitride interposed between the first write electrode and the floating gate for transporting charge between the floating gate and the first write electrode to write the floating gate to a first voltage level; a second write electrode formed in a substrate region and being adapted for receiving a selected reference voltage and underlying and being in capacitive relationship with the floating gate through an interposed dielectric layer selected from silicon nitride and silicon oxynitride for transferring charge between the floating gate and the second write electrode to write the floating gate to a second voltage level; and means for applying a selected voltage to the control electrode to select writing to the first or second voltage level.

5. The nonvolatile memory cell of claim 1, 2, 3 or 4 wherein the dielectric layer is the silicon nitride of thickness about 100–200 Angstroms.

* * * * *